(12) United States Patent
Kitsukawa et al.

(10) Patent No.: US 7,211,842 B2
(45) Date of Patent: May 1, 2007

(54) SYSTEM WITH MESHED POWER AND SIGNAL BUSES ON CELL ARRAY

(75) Inventors: Goro Kitsukawa, Nishitama-gun (JP); Takesada Akiba, Tachikawa (JP); Hiroshi Otori, Ome (JP); William R. McKee, Plano, TX (US); Jeffrey E. Koelling, Dallas, TX (US); Troy H. Herndon, Richardson, TX (US)

(73) Assignees: Hitachi, Ltd., Tokyo (JP); Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/158,379

(22) Filed: Jun. 22, 2005

(65) Prior Publication Data

US 2005/0237778 A1    Oct. 27, 2005

Related U.S. Application Data

(60) Continuation of application No. 10/945,351, filed on Sep. 20, 2004, now Pat. No. 6,967,371, which is a continuation of application No. 10/728,682, filed on Dec. 5, 2003, now Pat. No. 6,815,742, which is a continuation of application No. 10/315,307, filed on Dec. 10, 2002, now Pat. No. 6,831,317, which is a continuation of application No. 10/120,872, filed on Apr. 11, 2002, now Pat. No. 6,512,257, which is a continuation of application No. 09/909,191, filed on Jul. 19, 2001, now Pat. No. 6,396,088, which is a continuation of application No. 09/496,079, filed on Feb. 1, 2000, now Pat. No. 6,288,925, which is a continuation of application No. 09/330,579, filed on Jun. 11, 1999, now Pat. No. 6,069,813, which is a continuation of application No. 08/991,727, filed on Dec. 16, 1997, now Pat. No. 5,953,242, which is a division of application No. 08/728,447, filed on Oct. 10, 1996, now Pat. No. 6,115,279.

(60) Provisional application No. 60/005,502, filed on Nov. 9, 1995.

(51) Int. Cl.
*H01L 27/10* (2006.01)

(52) U.S. Cl. .................... 257/207; 257/208; 257/211

(58) Field of Classification Search ............... 257/288, 257/207, 208, 211
See application file for complete search history.

(56) References Cited

U.S. PATENT DOCUMENTS 4,673,966 A    6/1987    Shimoyama (Continued)

FOREIGN PATENT DOCUMENTS

| EP | 0239913 A2 | 7/1987 |
|---|---|---|
| EP | 0281868 A2 | 9/1998 |

OTHER PUBLICATIONS

Noda, K., et al., "A Boosted Dual Word-Line Decoding Scheme for 256Mb DRAMs", IEEE Symposium on VLSI Circuits Digest of Technical Papers, 1992, pp. 112-113.

(Continued)

*Primary Examiner*—Doug Menz
(74) *Attorney, Agent, or Firm*—Haynes and Boone, LLP

(57) ABSTRACT

A method and apparatus for providing a meshed power and signal bus system on an array type integrated circuit that minimizes the size of the circuit. In a departure from the art, through-holes for the mesh system are placed in the cell array, as well as the peripheral circuits. The power and signal buses of the mesh system run in both vertical and horizontal directions across the array such that all the vertical buses lie in one metal layer, and all the horizontal buses lie in another metal layer. The buses of one layer are connected to the appropriate bus(es) of the other layer using through-holes located in the array. Once connected, the buses extend to the appropriate sense amplifier drivers. The method and apparatus are facilitated by an improved subdecoder circuit implementing a hierarchical word line structure.

3 Claims, 12 Drawing Sheets

U.S. PATENT DOCUMENTS

| | | | |
|---|---|---|---|
| 4,975,874 A | 12/1990 | Childers et al. | |
| 5,040,144 A * | 8/1991 | Pelley et al. | 365/51 |
| 5,119,169 A | 6/1992 | Kozono et al. | |
| 5,222,038 A | 6/1993 | Tsychida et al. | |
| 5,341,326 A | 8/1994 | Takase et al. | |
| 5,369,612 A | 11/1994 | Furuyama | |
| 5,375,095 A * | 12/1994 | Yamada et al. | 365/230.03 |
| 5,388,068 A | 2/1995 | Ghoshal et al. | |
| 5,391,900 A | 2/1995 | Onodera et al. | |
| 5,463,577 A | 10/1995 | Oowaki et al. | |
| 5,559,350 A | 9/1996 | Ozaki et al. | |
| 5,650,972 A | 7/1997 | Tomishima et al. | |

OTHER PUBLICATIONS

Sugibayashi, Tadahiko, et al., "A 30-ns 256Mb DRAM with a Multidivided Array Structure", IEEE Journal of Solid State Circuits, vol. 28, No. 11, Nov. 1993, pp. 1092-1098.

Yamada, Toshio, et al., "A 64-Mb DRAM with Meshed Power Line", IEEE Journal of Solid-State Circuits, vol. 26, No. 11, Nov. 1991, pp. 1506-1510.

* cited by examiner

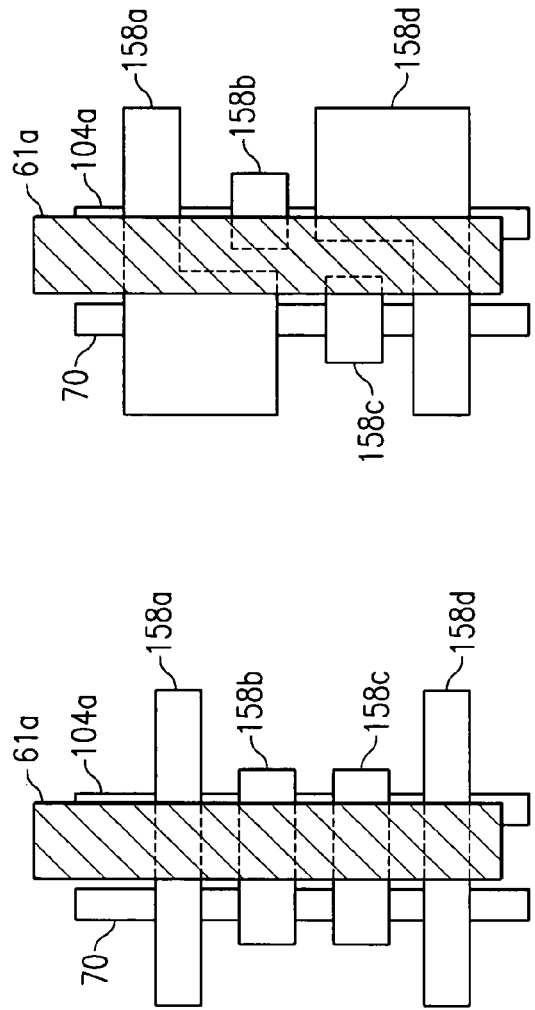
Fig. 13c
Fig. 13b
Fig. 13a (PRIOR ART)
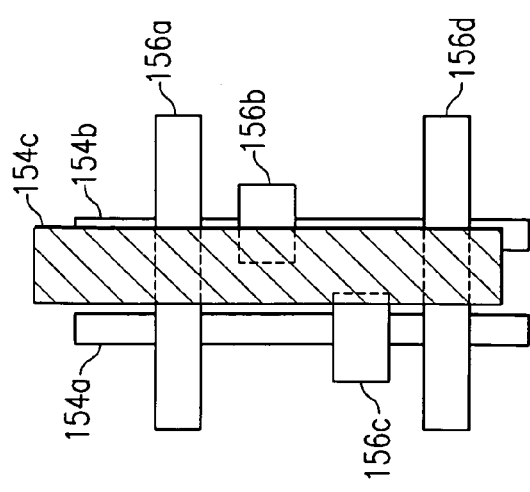
Fig. 12b
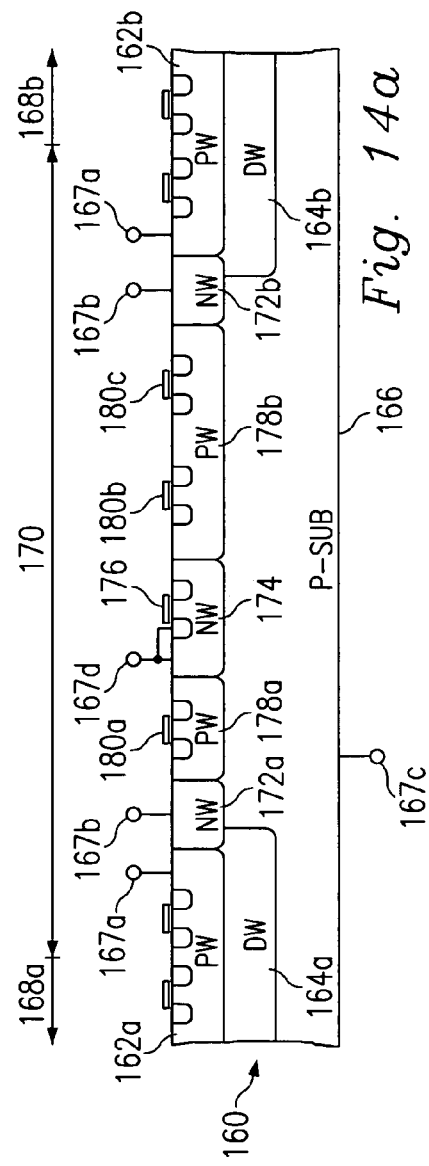
Fig. 14a

SYSTEM WITH MESHED POWER AND SIGNAL BUSES ON CELL ARRAY

CROSS REFERENCE

This application is a Continuation of Ser. No. 10/945,351, filed Sep. 20, 2004, now U.S. Pat. No. 6,967,371 which is a Continuation of Ser. No. 10/728,682, filed Dec. 5, 2003, now issued U.S. Pat. No. 6,815,742, which is a Continuation of Ser. No. 10/315,307, filed Dec. 10, 2002, now issued U.S. Pat. No. 6,831,317, which is a Continuation of Ser. No. 10/120,872, filed Apr. 11, 2002, now issued U.S. Pat. No. 6,512,257; which is a Continuation of Ser. No. 09/909,191, filed Jul. 19, 2001, now issued U.S. Pat. No. 6,396,088; which is a Continuation of Ser. No. 09/496,079, filed Feb. 1, 2000, now issued Pat. No. 6,288,925; which is a Continuation of Ser. No. 09/330,579, filed Jun. 11, 1999, now issued U.S. Pat. No. 6,069,813; which is a Continuation of Ser. No. 08/991,727, filed Dec. 16, 1997, now issued U.S. Pat. No. 5,953,242; which is a Divisional of Ser. No. 08/728,447, filed Oct. 10, 1996, now issued U.S. Pat. No. 6,115,279; which claims benefit of priority Provisional Ser. No. 60/005,502, filed Nov. 9, 1995.

FIELD OF THE INVENTION

The invention relates generally to semiconductor circuit design and, more particularly, to a method and apparatus for interconnecting power and signal buses in an integrated circuit.

BACKGROUND OF THE INVENTION

As semiconductor technology develops, the number of transistors included in a single integrated circuit, or "chip" is becoming larger and the design rule parameters therefore are becoming smaller. These two developments contribute to increased metal layer resistance and to difficulties associated with this increased resistance. Such difficulties include ground bounce, cross talk noise, and circuit delays. All of these difficulties slow down chip operation and may even corrupt data stored on the chip. Eliminating the impact of increased metal layer resistance is an important design challenge in most semiconductor designs, including designs for dynamic random access memory (DRAM) devices.

One solution to this problem has been the development of a meshed power bus system for the chip, as described in Yamada, *A 64-Mb DRAM with Meshed Power Line*, 26 IEEE Journal of Solid-State Circuits 11 (1991). A meshed power bus system is readily implemented in integrated circuits like DRAMs because of their large arrays of memory cells and the presence of distributed sense amplifier drivers. The meshed system supplies adequate power to the distributed sense amplifier drivers because the system has many power buses running in both horizontal and vertical directions across the arrays.

The Yamada meshed system may be implemented using a conventional complimentary metal oxide semiconductor (CMOS) technology, including first, second and third metal layers, each electrically isolated from each other, wherein the first metal layer represents the lowest metal layer, the third metal layer represents the upper-most metal layer, and the second metal layer lies between the first and third layers. The Yamada meshed system is constructed in the second and third metal layer and includes a positive supply voltage ($V_{DD}$) mesh and a negative supply voltage ($V_{SS}$) mesh, for the $V_{DD}$ power buses and the $V_{SS}$ power buses, respectively. Conventional designs have these meshes running over the memory array and connecting at the sense amplifiers. Connections are made using through-holes, located in the area of the sense amplifier circuits. However, the presence of $V_{DD}$ and $V_{SS}$ power buses in the sense amplifiers is unnecessary, since these circuits do not require either $V_{DD}$ or $V_{SS}$ power buses, except for well bias.

As a result, the sense amplifiers, due to their relatively small size and numerous associated signal and power buses, are adversely affected by the Yamada meshed system. The Yamada meshed system overcrowds the sense amplifiers with additional power and signal buses. In addition, the metal line width required for overlapping through-holes is larger than the minimum metal line width and therefore increases the width of the metal layers even further. As a result, the metal layer over the sense amplifiers becomes determinative of the size of the sense amplifier circuits. Accordingly, their size reduction must be realized by tightening the metal width, inevitably resulting in increased resistance and slower operation.

In addition to the Yamada meshed system, other proposals have been made for conventional DRAM design. Recently, a hierarchical word line scheme was proposed in K. Noda et Al., *a Boosted Dual Word-line Decoding Scheme for 256 Mbit DRAM's*, 1992 Symp. on VLSI Circuits Dig. of Tech. Papers, pp. 112–113 (1992). The Noda scheme includes main word lines, constructed in the second metal line layer, and subword lines constructed in a poly silicon layer. The Noda scheme describes two main word lines (one true, one bar) for every eight subword lines, and is thereby able to relax the main word line pitch to four times that of the subword line. However, this pitch would not support an improved meshed power and signal bus system.

Consequently, there is a need for a meshed power and signal bus system on an array-type integrated circuit that does not limit mesh through-hole connections to the area of the sense amplifiers, but provides for such connections at other locations on the array, thereby allowing for a relaxed metal width over the sense amplifiers and a reduction of the overall area of the chip with lower power bus resistance.

Furthermore, there is a need for a hierarchical word line scheme that supports an improved meshed power and signal bus system, that has a main word line pitch greater than four times that of the subword line pitch.

SUMMARY OF THE INVENTION

The present invention, accordingly, is a method and apparatus for providing a meshed power bus and signal bus system on an array-type integrated circuit that does not limit mesh through-hole connections to the area of the sense amplifiers, but provides for these connections at other locations on the array, thereby allowing for a relaxed metal width over the sense amplifiers, faster sense amplifier operation, and chip size reduction. The through-holes for the mesh system are located in the cell array instead of, or in addition to, being located in the area of the sense amplifier circuits. This utilizes the available space for through-holes in the array, and allows for more efficient use of power and signal buses in the sense amplifiers.

The invention includes an array of DRAM memory cells, arranged as a plurality of subarrays and selected by main address decoders. Each subarray is surrounded by a plurality of sense amplifiers circuits, subdecoder circuits, and $V_{DD}$, $V_{SS}$ and signal buses connecting to and running across the subarray. The $V_{DD}$ buses run in both vertical and horizontal directions across the subarray, with all the vertical buses lying in the third metal layer and all the horizontal buses lying in the second metal layer, thereby creating a $V_{DD}$ mesh. The buses in each layer are connected to each other using through-holes located in the memory cell subarray as well as on the sense amplifier area. Likewise, a $V_{SS}$ mesh and/or a signal mesh is created using through-holes located on the memory cell subarray. Once connected, the buses extend to the appropriate circuits, such as sense amplifier drive circuits, and the metal layer and through-hole requirement over the sense amplifiers is significantly reduced.

The invention also includes a hierarchical word line scheme. To facilitate the combination of the above-mentioned meshed system and the hierarchical word line scheme, the Noda hierarchical word line scheme should also be improved to provide a greater pitch of main word lines to subword lines. In the improved hierarchical word line system, an intersection area, created between the sense amplifier and the subdecoder, includes subdecoder drivers as well as sense amplifier drivers. This combination provides high speed word line selection and high speed sense amplifier operation at the same time.

Once the sense amplifier size is no longer determined by the metal usage, as provided by the above-mentioned meshed system, an improved layout technique for the sense amplifier circuits may be necessary to match the fine memory cell size. This improved layout technique includes an alternating T-shaped gate region for a bit line equalization circuit and an H-shaped moat region with a metal-to-polysilicon-to-metal change structure for a latch circuit.

A technical advantage achieved with the invention is the ability to fully utilize the low resistance design of a meshed power system without having to increase the size of the peripheral circuits, for example, sense amplifiers, that are limited in size by their metal layers.

A further technical advantage achieved with the invention is that both signal and power buses may freely run in both horizontal and vertical directions.

A further technical advantage achieved with the invention is that the design for through-holes located in the array area or on a step difference compensation area do not have to be made to the minimum design widths like the through-holes located in the peripheral area, and therefore the yield is improved.

A further technical advantage achieved with the invention is that the improved hierarchical word line structures are smaller and faster than conventional hierarchical word line structures.

BRIEF DESCRIPTION OF THE DRAWINGS

FIG. 10a is a schematic diagram of the two sense amplifier circuits of FIG. 7a.

FIG. 10b is a layout diagram of the sense amplifier circuits of FIG. 10a.

FIG. 12b is a simplified diagram of the H-shaped moat region of FIG. 12a.

FIG. 13a is a metal layout diagram of a section of a conventional sense amplifier.

FIGS. 13b–c are metal layout diagrams of an improved section of the sense amplifier of FIG. 7a, implementing a noise decreasing method of the present invention.

FIG. 14a is a first cross sectional view of a sense amplifier using a triple well structure.

DETAILED DESCRIPTION OF THE INVENTION

Figure 1:
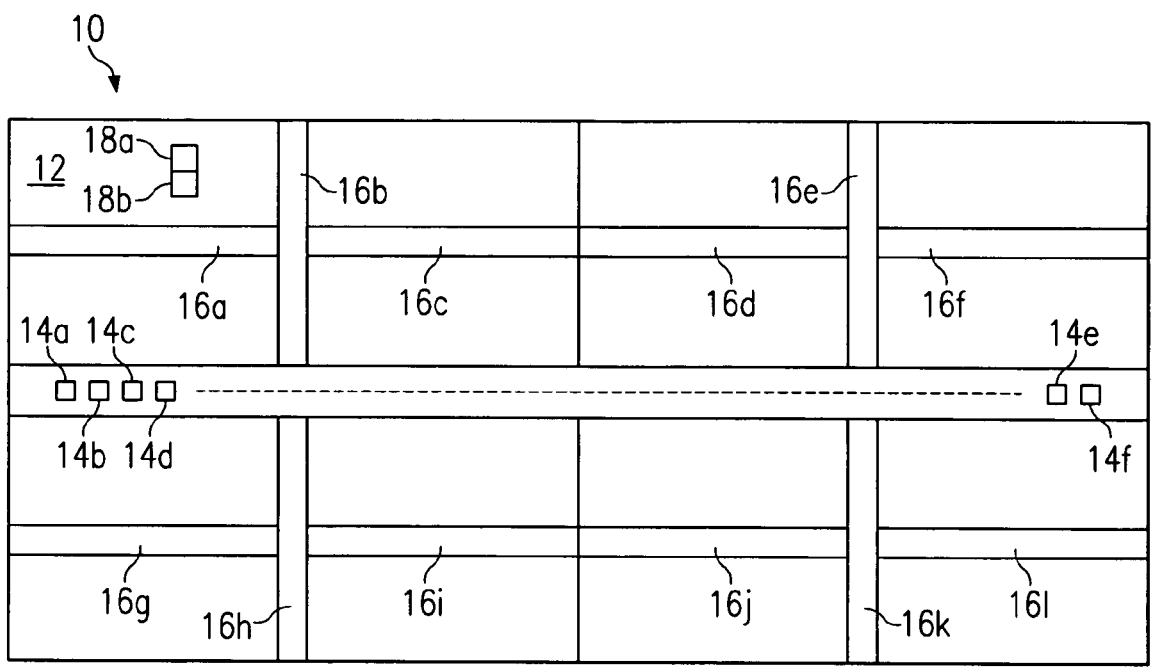
FIG. 1 is a block diagram of a 256 Mbit DRAM embodying features of the present invention.

In FIG. 1 the reference numeral 10 refers to a memory device embodying features of the present invention. The device 10 is fabricated using a conventional CMOS technology, including first, second and third metal layers and a polysilicon layer. The device 10 also utilizes metal oxide semiconductor field effect transistors (MOSFETs), but other types of transistors may also be used, such as bipolar, and metal insulator semiconductors. Furthermore, while in a preferred embodiment of the invention, the device 10 is a 256 Mbit dynamic random access memory (DRAM), it should be understood that the present invention is not limited to use with a 256 Mbit DRAM, but may be used in conjunction with other devices having arrays, including a programmable array logic, a 1 Gbit DRAM and other memory devices.

The device 10 includes a set of array blocks of memory cells, such as an array block 12, a group of pads 14a–14f, and a group of main address decoders 16a–16l, wherein decoders 16b, 16e, 16h and 16k are row decoders and decoders 16a, 16c, 16d, 16f, 16g, 16i, 16j and 16l are column decoders. The array block 12 is selected by signals from the address pads 14a–14d. It should be understood that while more address and signal pads exist, they may be represented by address pads 14a–14d, which are decoded by main address decoders 16a–16l. The main address decoders 16a–16l represent a plurality of row and column decoders. The row decoders generate signals including main-word signals MWB and subdecoder control signals DXB, and the column decoders generate signals such as column select signals YS. These signals are controlled by different address signals from the address pads 14a–14d, as discussed in greater detail below.

Figure 2:
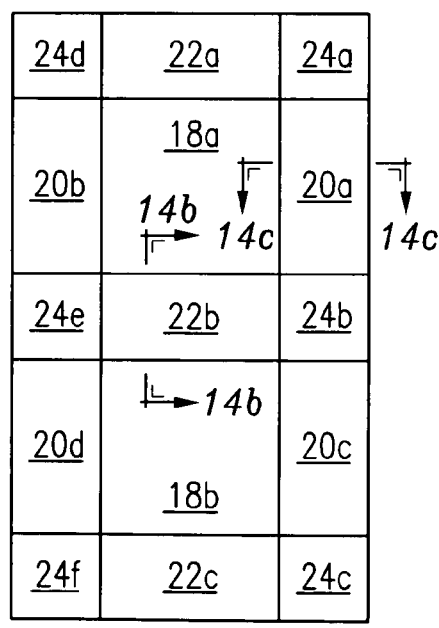
FIG. 2 is a block diagram of two subarrays and surrounding sense amplifiers and subdecoders of the DRAM of FIG. 1.

Array block 12, which is representative of the 16 Mbit array blocks, is further divided into 256 subarrays, two of which are shown in FIG. 2, and are respectively designated by reference numerals 18a and 18b. Each subarray consists of 128K of memory cells (arranged as 512 rows by 256 columns).

Power is supplied to the device 10 through power pads 14e and 14f. The pad 14e is the positive supply voltage ($V_{DD}$) power pad and is connected to an external power supply (not shown). The pad 14f is the negative supply voltage ($V_{SS}$) power pad and is connected to an external ground (also not shown).

Referring to FIG. 2, the memory cells of the subarray 18a are selected by signals from two groups of address subdecoders 20a and 20b. Likewise, the memory cells of the subarray 18b are selected by signals from two groups of address subdecoders 20c and 20d. The memory cells of subarray 18a are read by two groups of sense amplifiers 22a and 22b. Likewise, the memory cells of subarray 18b are read by two groups of sense amplifiers 22b and 22c. The sense amplifiers 22a–22c intersect with the subdecoders 20a–20d, at intersection areas 24a–24f. In this way, intersection areas 24a–24f are created by the extension of sense amplifier areas 22a–22c and subdecoder areas 20a–20d.

Figure 3:
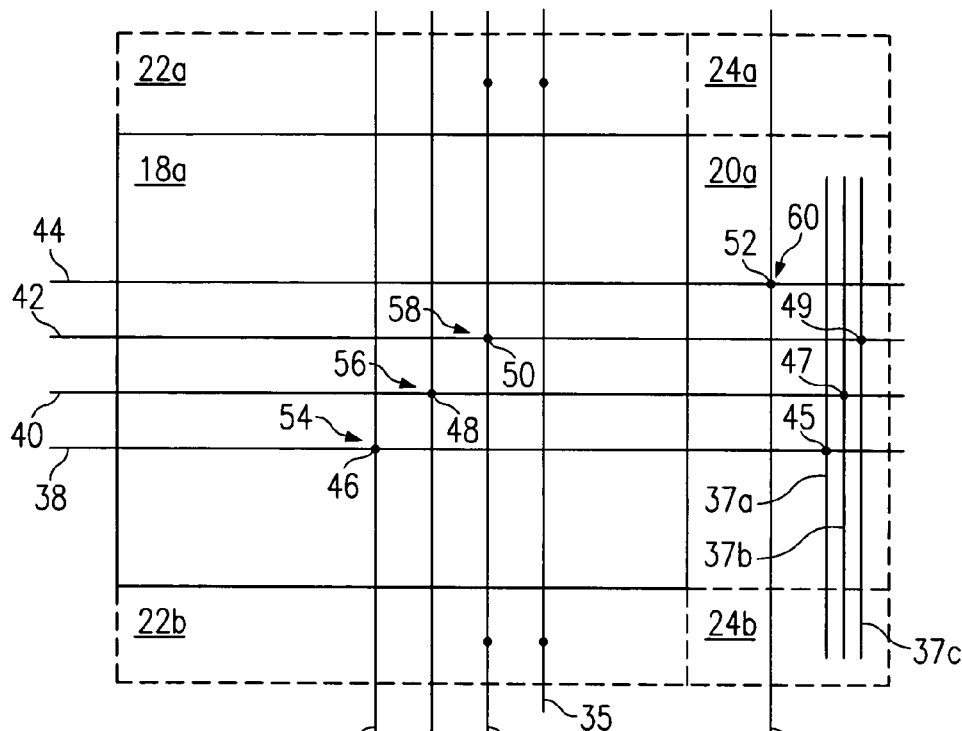
FIG. 3 is a block diagram of one subarray, two sense amplifiers, and a subdecoder, as shown in FIG. 2, and a meshed power and signal system running across the subarray.

Referring to FIG. 3, the pads 14e and 14f act as electrical ports to supply power to the entire device 10 through main $V_{DD}$ and $V_{SS}$ power buses 28 and 26, respectively. The main $V_{DD}$ and $V_{SS}$ power buses 28 and 26 supply power to the device 10 through a plurality of buses, located in different metal layers. The metal layers are layered onto a silicon substrate, in the order of: a first metal layer (M1), a second metal layer (M2), and a third metal layer (M3). Each of the metal layers M1, M2, M3 is electrically isolated from each other, but may be electrically interconnected at intersection points using through-holes. Each metal layer M1, M2, M3 also has associated therewith a thickness such that the thickness for M3 is greater than the thickness for M2, which is greater than the thickness for M1.

A first $V_{DD}$ bus 30, comprising a conductor constructed in the third metal layer M3, extends in a vertical path across the subarray 18a. A first $V_{SS}$ bus 32, also a conductor constructed in M3, extends in a vertical path across the memory subarray 18a, parallel with the bus 30. Similarly, a first signal bus 34 and a first column select YS bus 35, conductors constructed in M3, run vertically across the subarray 18a parallel with power buses 30 and 32. A first subdecoder DXB bus 36, also a conductor constructed in M3, runs vertically across address subdecoder 20a, outside of the subarray 18a.

A second $V_{DD}$ bus 37a, a second $V_{SS}$ bus 37b and a second signal bus 37c, conductors constructed in M3, run vertically across the subdecoder 20a and the intersection areas 24a and 24b. The second $V_{DD}$ bus 37a and the second $V_{SS}$ bus 37b have a width that is less than a width of the first $V_{DD}$ bus 30 and the first $V_{SS}$ bus 32, respectively.

A third $V_{DD}$ bus 38 and a third $V_{SS}$ bus 40, along with a third signal bus 42 and a second DXB bus 44, are also conductors similar to those described above, except that they are constructed in the second metal layer M2, and extend in parallel, horizontal paths across the memory subarray 18a. The third $V_{DD}$ bus 38 electrically connects with the second $V_{DD}$ bus 37a within the subdecoder 20a at their intersection point 45 over the peripheral circuit area 20a and the first $V_{DD}$ bus 30 at their intersection point 46 within the memory subarray 18a. Likewise, the third $V_{SS}$ bus 40 electrically connects with the second $V_{SS}$ bus 37b at their intersection point 47 within the subdecoder 20a and the first $V_{SS}$ bus 32 at their intersection point 48 within the memory subarray 18a. Furthermore, the third signal bus 42 electrically connects with the second signal bus 37c at their intersection point 49 within the subdecoder 20a and the first signal bus 34 at their intersection point 50 within the memory subarray 18a. Finally, the second DXB bus 44 electrically connects with the first DXB bus 36 at their intersection point 52 in the subdecoder circuit 20a. Each of the intersection points is achieved using through-holes, as discussed in greater detail with reference to FIGS. 5a–6c.

Associated with each bus is a line width, it being understood that a bus with a larger surface area (width and thickness) provides a lower resistance current path. The first $V_{DD}$ and $V_{SS}$ bus 30, 32 have a line width of 1.8 microns. The second $V_{DD}$ and $V_{SS}$ bus 37a, 37b have a line width of 0.7 microns. The third $V_{DD}$ and $V_{SS}$ bus 38, 40 have a line width of 1.8 microns. Likewise, the through-holes have associated therewith a diameter, it being understood that a through-hole with a larger surface area (diameter) provides a lower resistance current path. The through-holes located above the memory subarray 18a have a diameter of 0.6 microns, while the through-holes located above the subdecoder circuit 20a have a diameter of 0.8 microns.

$V_{DD}$ and $V_{SS}$ power is supplied through the external pads 14e and 14f the main power buses 28 and 26, respectively, as previously described in FIG. 3. The first $V_{DD}$ bus 30 is electrically connected to the main $V_{DD}$ power bus 28 thereby supplying $V_{DD}$ power to the first $V_{DD}$ bus, the second $V_{DD}$ bus 37a, and the third $V_{DD}$ bus 38. The first $V_{SS}$ bus 32 is electrically connected to the main $V_{SS}$ power bus 26 thereby supplying $V_{SS}$ power to the first $V_{SS}$ bus, the second $V_{SS}$ bus 37b, and the third $V_{SS}$ bus 40. In this manner, a $V_{DD}$ mesh 54 is created by the $V_{DD}$ buses 30, 37a and 38 and a $V_{SS}$ mesh 56 is created by the $V_{SS}$ buses 32, 37b and 40. As a result, each of the foregoing meshes have power buses running both vertically and horizontally across the subarray 18a, the subdecoder 20a and the intersection areas 24a–24b. Furthermore, the $V_{DD}$ and $V_{SS}$ meshes 54 and 56 significantly reduce the total power bus resistance from the power pads 14e and 14f to the subdecoder 20a, the intersection areas 24a–24b and other circuits, even when the widths of the $V_{DD}$ and $V_{SS}$ buses 37a and 37b are narrow.

A first peripheral circuit (not shown) drives electrical signals to the first signal bus 34 and the column decoder 16a (FIG. 1) drives electrical signals to the YS bus 35, which is used in sense amplifiers 22a and 22b. Likewise, main address decoder 16b (FIG. 1) drives electrical signals to the second DXB bus 44, in a conventional manner. The first signal bus 34 electrically connects with the second signal bus 37c and the third signal bus 42 thereby creating a signal mesh 58 across the subarray 18a and the subdecoder 20a. Likewise, the first DXB bus 36 electrically connects with the second DXB bus 44 thereby creating a subdecoder mesh 60 across the subdecoder 20a. In this manner, the signal and subdecoder meshes 58 and 60 are able to connect the sense amplifiers 22a–22b, the subdecoder 20a, and the intersection areas 24a–24b in many different combinations. Although not shown, there are many additional buses constructed in M2 and extending horizontally across the sense amplifier circuit areas 22a and 22b. Some of these buses are connected to other signal buses, such as the YS bus 35.

Figure 4:
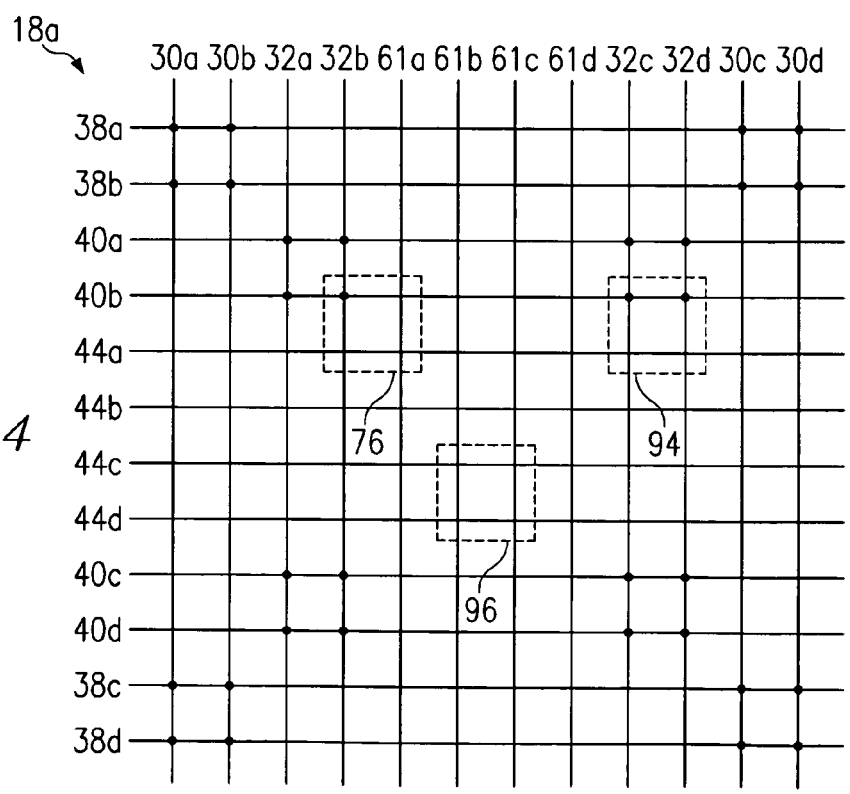
FIG. 4 is a schematic diagram of a meshed power and signal system over the subarray of FIG. 3.

Referring to FIG. 4, the V$_{DD}$, Vss, signal and subdecoder meshes 54, 56, 58 and 60 actually represent many vertical and horizontal lines for each mesh, thereby providing more buses for the surrounding circuits, and decreasing the resistance of each mesh. For example, the subarray 18a has multiple V$_{DD}$ buses 38a–38d running in M2 and multiple V$_{DD}$ buses 30a–30d running in M3, all tied to the main V$_{DD}$ bus 28 (FIG. 3), thereby decreasing the overall resistance of the V$_{DD}$ mesh 54. Likewise, the subarray 18a has multiple Vss buses 40a–40d running in M2 and multiple Vss buses 32a–32d running in M3, all tied to the main Vss bus 26 (FIG. 3), thereby decreasing the overall resistance of the Vss mesh 56.

In addition to the V$_{DD}$, Vss, signal and subdecoder meshes 54, 56, 58 and 60, other buses run across the subarray 18a. These other buses include multiple column factor (CF) buses 61a–61d running vertically in M3, for inputs to the column decoders 16a, 16c, 16d, 16f, 16g, 16i, 16j and 16l (FIG. 2), and multiple subdecoder buses (DXB1, DXB3, DXB5, DXB7) 44a–44d running horizontally in M2, for connection to the subdecoder circuits 20a and 20b (FIG. 2) and to the first DXB bus 36. Furthermore, as shown in FIG. 4, power buses 30a–30d, 32a–32d, 38a–38d, 40a–40d are located near an outer edge of the subarray 18a than the signal buses 61a–61d, 44a–44d. As a result, resistance of the power buses is reduced, while the resistance for the signal buses, all grouped toward the interior edge of the subarray 18a, are relatively consistent with each other, thereby making signal propagation through the signal buses relatively consistent.

Figure 5A:
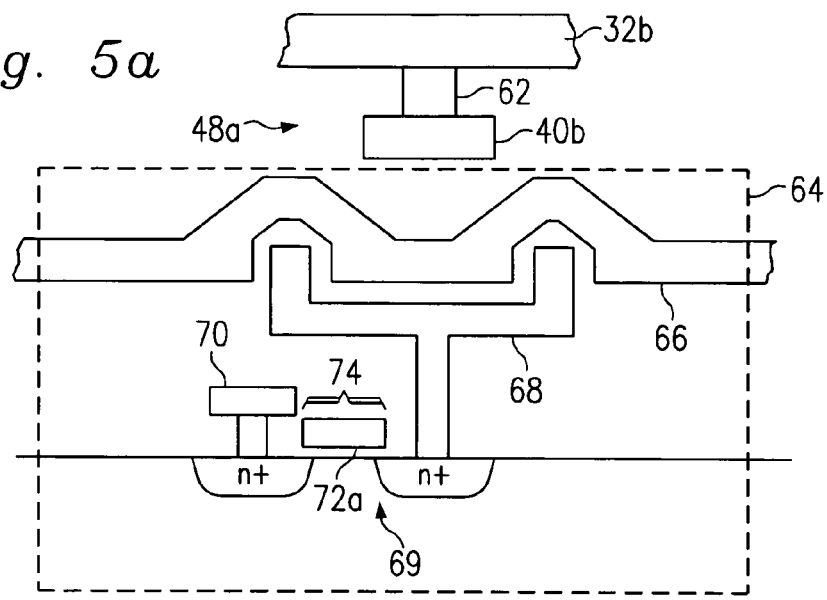
FIG. 5a is a cross sectional view of a memory cell of the subarray of FIG. 3 with a through-hole connecting two metal layers used in the meshed power system of FIG. 4.
Figure 5B:
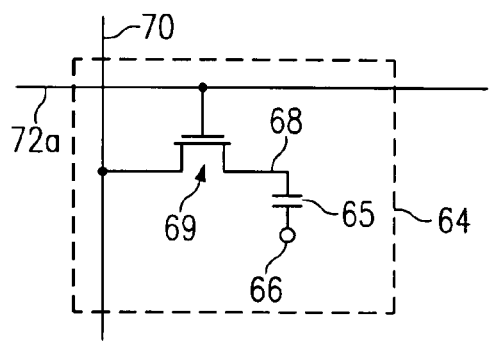
FIG. 5b is a detailed schematic of a memory cell of the subarray of FIG. 3.

Referring to FIG. 5a, the electrical connections between the buses shown in FIG. 4 are made at intersection points located above memory cells. An intersection point 48a denotes where the Vss bus 32b crosses the Vss bus 40b. An electrical connection is made between the Vss bus 32b and the Vss bus 40b using a through-hole 62, located above a memory cell circuit 64. Referring to FIGS. 5a–5b, the memory cell circuit 64 of the subarray 18a comprises a conventional, one capacitor and one transistor type DRAM cell. For example, a capacitor 65 is formed between a plate 67 and a storage node 68. Likewise, a transistor 69 is formed with the source and drain connected to the storage node 68 and a bit line (BL1) bus 70, respectively, and the gate connected to a first subword line (SW) bus 72a, having a width 74. To avoid any coupling noise caused by the power and signal buses, the cell structure of the preferred embodiment is a capacitor on bit line (COB) structure. This structure facilitates the sensitive nature of the BL1 bus 70 and enables operation without any detrimental effect by noise from the power and signal meshes 54, 56 and 58 located over the cell, due to the shielding affect of the plate 64.

Although the intersection point 48a appears to be located directly over the memory cell circuit 64, this is not required, and is only for the benefit of explanation. Furthermore, the through-hole 62 and Vss buses 32b and 40b are not necessary for memory cell 64 and not all of the power and signal buses will be connected to other buses.

Figure 6A:
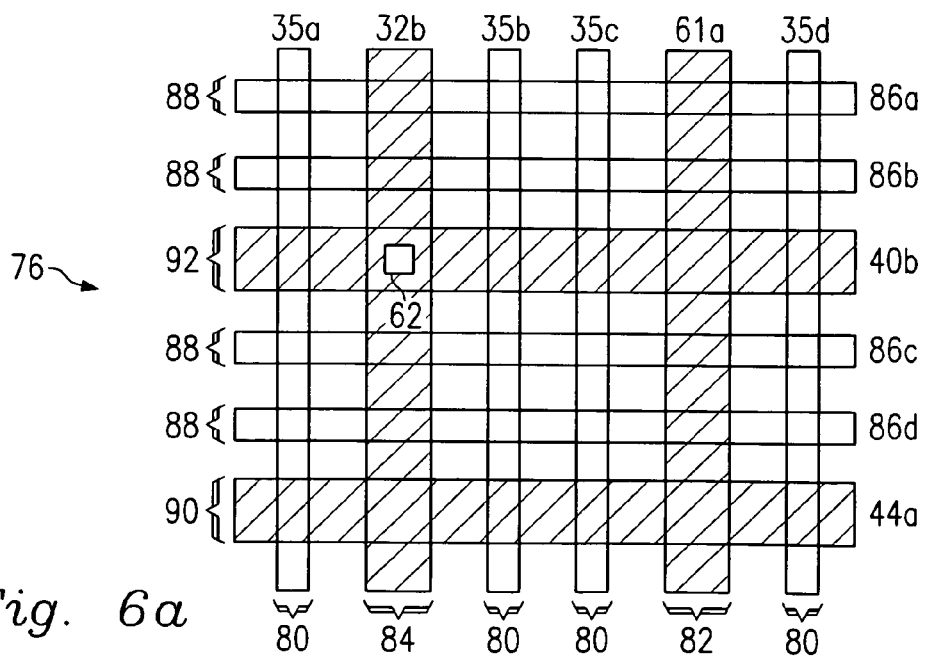
FIGS. 6a–6c are layout diagrams of expanded sections of the meshed system of FIG. 4.

Referring to FIGS. 4 and 6a, a first section 76 gives an expanded view of the subarray 18a, showing more signal lines located between the buses shown in FIG. 4. Section 76 has several signal and power buses of various widths running both vertically and horizontally across it. These buses include YS buses 35a–35d, having a width 80, the CF bus 61a, having a width 82, and the Vss bus 32b, having a width 84, running vertically in M3. Likewise, MWB buses 86a–86d, having a width 88, the DXB1 bus 44a, having a width 90 and the Vss bus 40b, having a width 92, run horizontally in M2. The signal buses YS 35a–35d, CF 61a, MWB 86 and DXB1 44a run directly to their corresponding circuits, and therefore do not require a through-hole on the subarray 18a to change directions. Only the Vss buses 32b and 40b have a through-hole 62 to electrically connect them. With this arrangement, the width of each bus, 80, 82, 84, 88, 90 and 92, is optimized for speed and power resistance effect. For example the widths 84 and 92 of the Vss buses 32b and 40b, the width 82 of the CF bus 61a, and the width 90 of the DXB1 bus 44a are wider than the widths 80 and 88 for high speed and low power resistance, and to accommodate the through-hole 62. Meanwhile, the width 80 of the YS buses 35 and the width 88 of the MWB buses 86, are made narrower than the widths 82, 84, 90, 92 to conserve metal space.

Figure 6B:
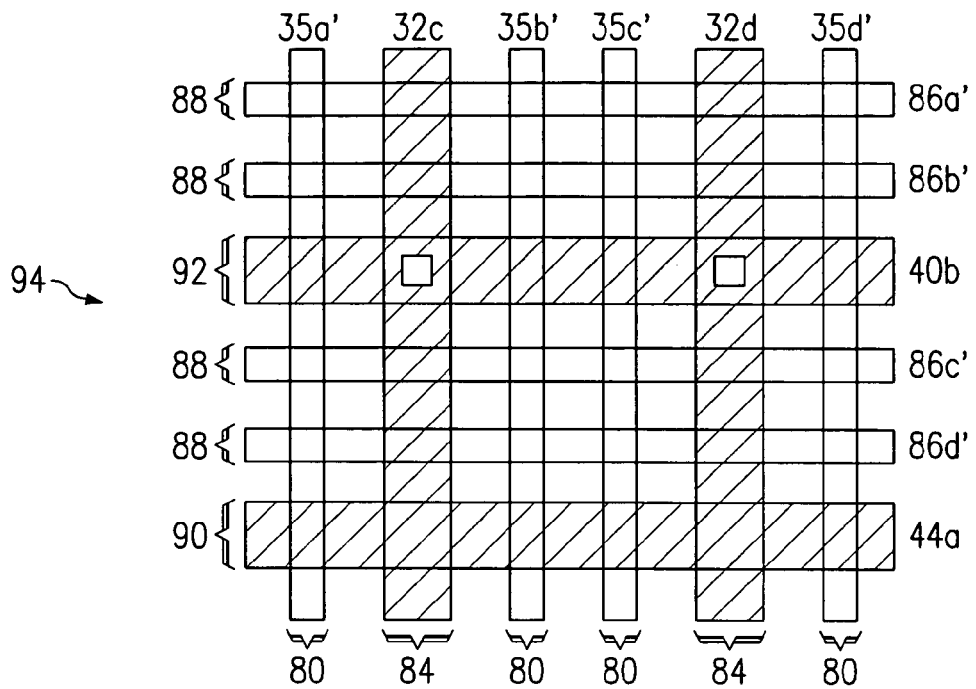
Figure 6C:
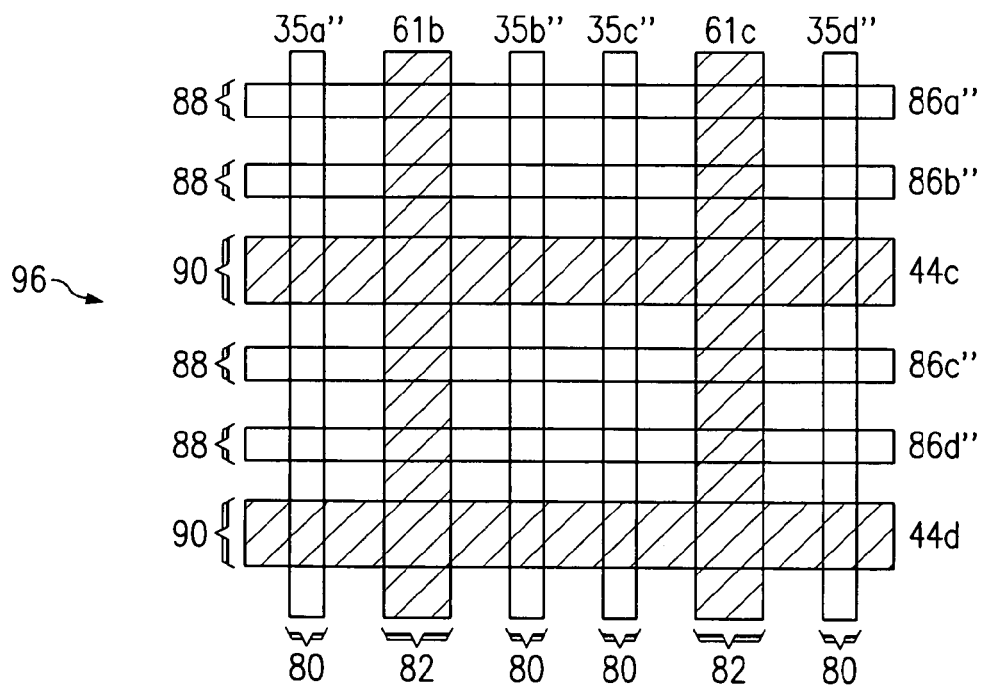

Likewise, referring to FIGS. 6b and 6c, sections 94 and 96 are shown, having two and no through-holes, respectively. As a result, two YS buses and one CF bus (or two YS buses and one power bus) are created with every four sense amplifier circuits, while still meeting acceptable M3 width and space requirements. Likewise, two MWB buses and one DXB bus (or two MWB buses and one power bus) are placed with every sixteen sub-word-line SW buses, while still meeting acceptable M2 width and space requirements. In addition, the widths of all the power and signal buses may be optimized to accommodate the multiple buses used by each mesh for reducing effective resistance and for achieving high speed, keeping the essential advantage of high yield by having the relaxed metal pitch of hierarchical word-line configuration.

Referring again to FIG. 3, in addition to the power and signal meshes 54, 56, and 58 being constructed over the subarray 18a, they are partially constructed over the subdecoder 20a, along with the subdecoder mesh 60. Other circuits are modified to accommodate the metal space needed by the power and signal meshes 54, 56, 58 and 60. The modified circuits are included in the sense amplifiers, the subdecoders and the intersection areas, as described below.

Figure 7A:
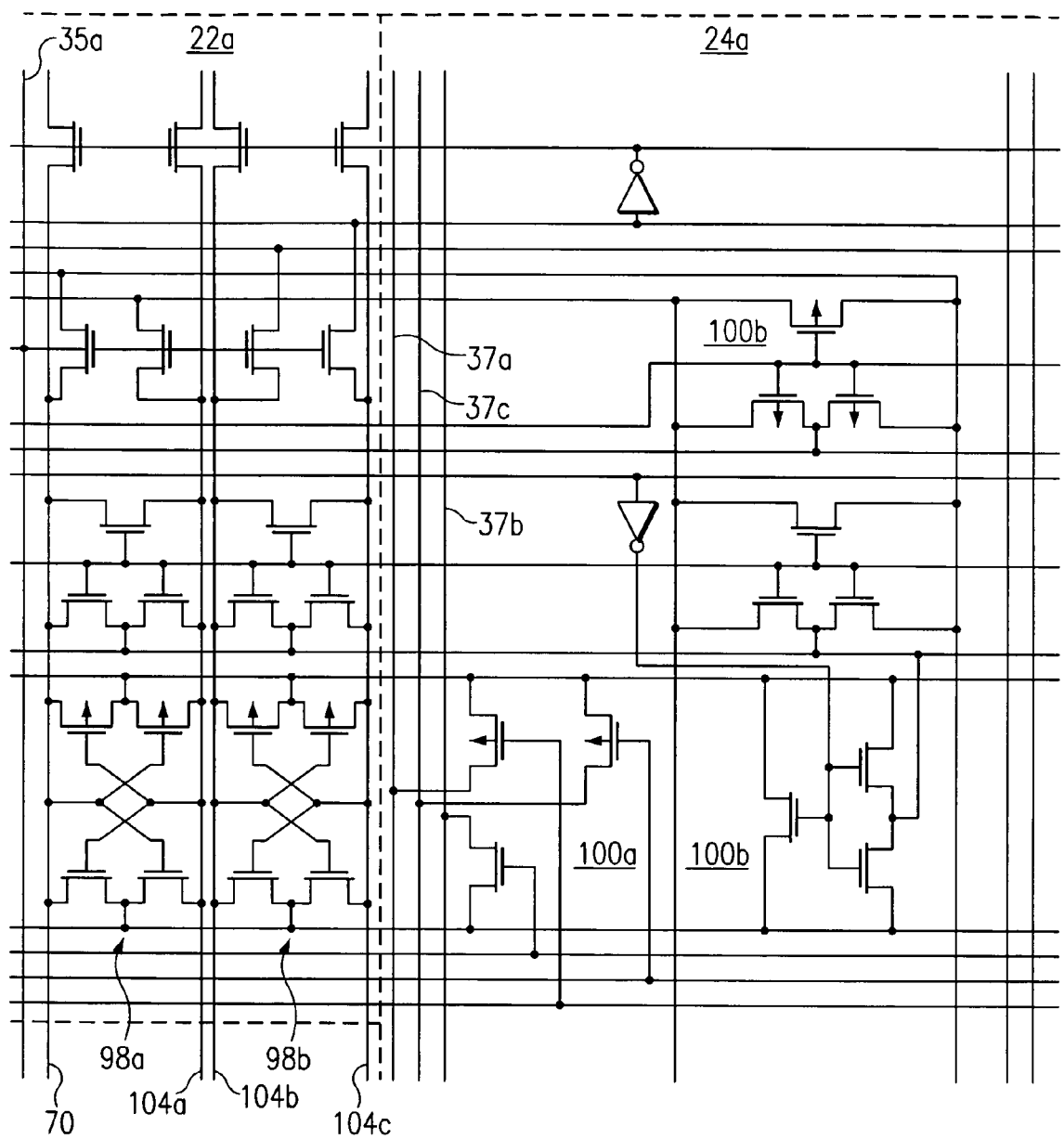
FIGS. 7a–b are schematic diagrams of circuits included in the intersection area, sense amplifier, subdecoder and memory array of FIG. 3.
Figure 7B:
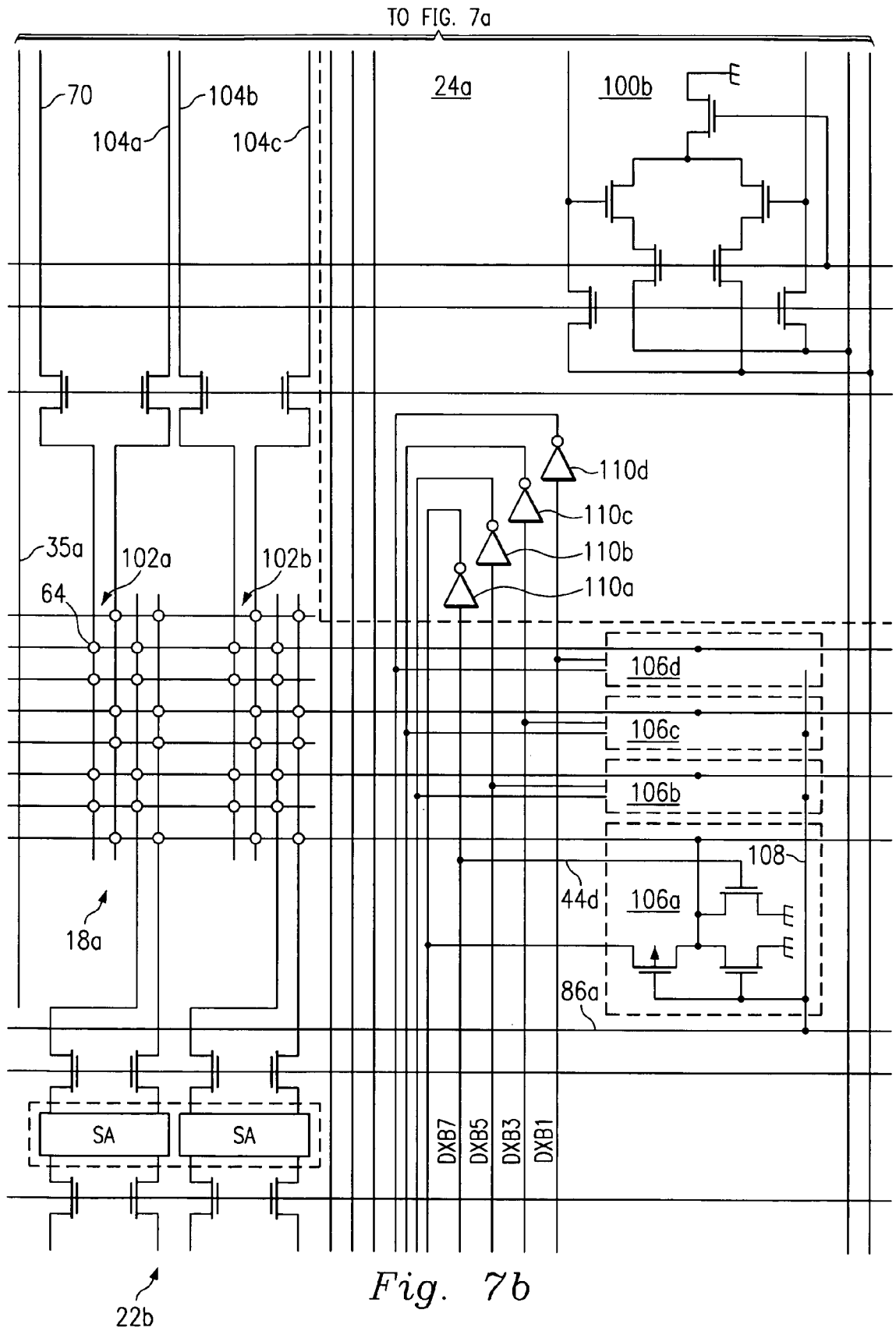

FIGS. 7a and 7b illustrate the subarray 18a comprising 32 representative memory cells including the memory cell 64 of FIGS. 5a–b. Furthermore, the subarray 18a is shown in relation to the intersection area 24a, the subdecoder 20a, and the sense amplifier 22a of FIG. 2.

In the preferred embodiment, the sense amplifier 22a includes 128 sense amplifier circuits, such as sense amplifier circuits 98a and 98b. Both of the sense amplifier circuits 98a–98b are connected to a sense amplifier driver 100a, which is located in the intersection area 24a. The sense amplifier circuit 98a is connected to a column of memory cells 102a, through the BL1 bus 70 (FIG. 5a) and a bit line (BL1B) bus 104a, which are both constructed in M1, and run vertically across the array 18a. Likewise, the sense amplifier circuit 98b is connected to a column of memory cells 102b, through a bit line (BL2) bus 104b and a bit line (BL2B) bus 104c, which are also constructed in M1, and run vertically across the array 18a. Sense amplifier circuits 98a–98b are discussed in greater detail with reference to FIGS. 10a–10b, below.

In addition to the sense amplifier driver 100a, the intersection area 24a includes a plurality of circuits (excluding sense amplifier driver 100a and subdecoder drivers 110a–110d) which are referenced generally by the numeral 100b. These circuits 100a–100b are designed to employ the advantages of the low resistance of the $V_{DD}$, $V_{SS}$ and signal meshes 54, 56 and 58, as supplied by the buses 37a–37c.

The subdecoder 20a includes 256 subdecoder circuits, represented generally be subdecoder circuit 106a–106d. The subdecoder circuit 106a illustrates a hierarchical word line structure utilized in each of the remaining subdecoder circuits. The subdecoder circuit 106a is connected to the DXB7 bus 44d and the MWB bus 86a, which is routed to the four subdecoder circuits 106a–106d through a connector bus 108, constructed in M1. The subdecoder circuit 106a is also connected to a first subdecoder driver 110a, located in the intersection area 24a, along with the sense amplifier driver 100. Likewise subdecoder circuits 106b–106d are connected to subdecoder drivers 110b–110d, located in the intersection areas. The subdecoder 20a is discussed with more detail below.

Figure 8:
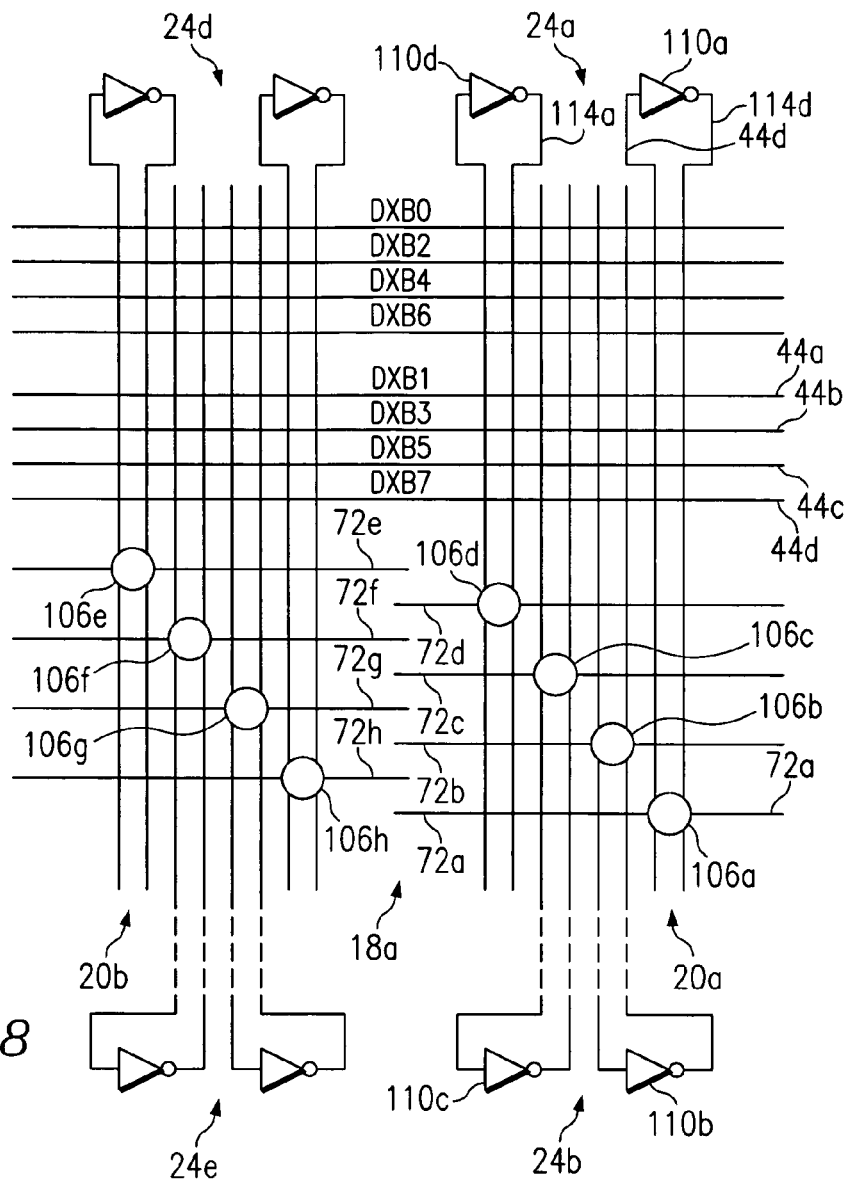
FIG. 8 is a diagram of the subdecoder circuits of FIGS. 7.

Referring to FIG. 8, two subdecoder drivers 110a–110d are located in intersection area 24a, while the other two subdecoder drivers 110b–110c are located in the intersection area 24b. The subdecoder driver 110a comprises an inverter, which converts the DXB7 bus 44d, to an inverted subdecoder (DX7) bus 114d. Likewise, the subdecoder drivers 110b–d convert the DXB1 44a, DXB3 44b and DXB5 44c to inverted subdecoder buses DX1 114a, DX3 114b and DX5 114c. In the preferred embodiment, each of the subdecoder drivers 110a–110d drive 64 subdecoder circuits, thereby driving all 256 of the subdecoder 20a. Being located in the intersection areas 24a–24b, the subdecoder drivers 110a–110d are made of significant size, and are supplied an internally generated boosted voltage ($V_{PP}$) so that the buses DX1 114a, DX3 114b, DX5 114c and DX7 114d can be driven to $V_{PP}$.

The subdecoder circuits 106a et seq. employ a hierarchical word line structure. As discussed earlier, the subdecoder circuits formed in the subdecoder area 20a and 20b are used to select certain memory cells in the subarray 18a. This is accomplished by utilizing a plurality of subword lines, such as the line 72a, constructed in the polysilicon (FG) layer (FIG. 5a). The MWB bus 86a drives four subdecoder circuits 106a–106d of subdecoder are 20a, which each drive a SW bus 72a–72d, extending into the subarray 18a. Likewise, the MWB bus 86a drives four additional subdecoder circuits 106e–106h of subdecoder area 20b, which each drive a SW bus 72e–72h, extending into the subarray 18a.

Figure 9A:
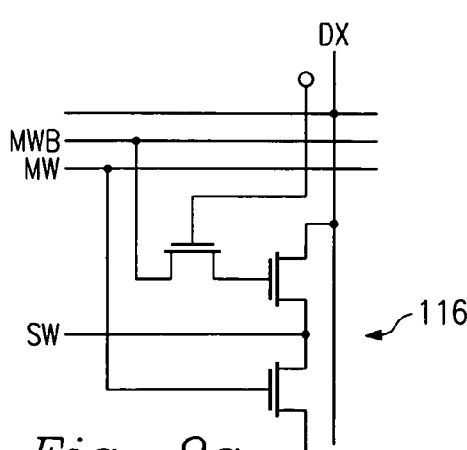
FIG. 9a is a schematic diagram of a prior art subdecoder circuit showing the Noda hierarchical word line implementation.
Figure 9B:
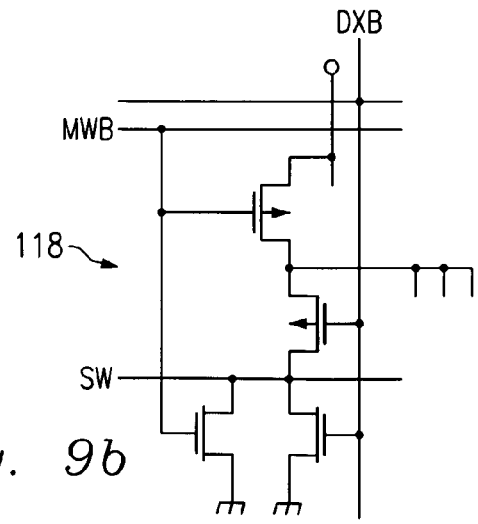
FIG. 9b is a schematic diagram of one subdecoder circuit showing a hierarchical word line implementation.

Referring to FIGS. 9a–9b, a conventional subdecoder circuit 116 and an alternative subdecoder circuit 118 implement a hierarchical word line structure. The structures are hierarchical due to the placement of main word line buses, constructed in M2, over a subword line buses, constructed in FG. However, the subdecoder circuits 116, 118 do not facilitate the meshed system of the present invention.

Referring to FIG. 9a, the conventional subdecoder circuit 116, as used in the Noda hierarchical word line structure scheme, consists of three n-type metal oxide semiconductor (NMOS) transistors and produces an SW output. However, the subdecoder circuit 116 requires a non-inverted word line (MW) bus, which must also run across the array (not shown) along with a MWB bus. This effectively doubles the number of main word lines running in M2 across the array. As a result, two main word lines are used to drive eight subword lines, thereby creating a pitch of 4 subword lines to every main word line. This pitch, however, does not allow the extra metal space needed for the meshed system of the present invention.

Referring to FIG. 9b, the subdecoder circuit 118 consists of two NMOS transistors and two p-type metal oxide semiconductor (PMOS) transistors. The subdecoder driver does not require a non-inverted word line bus (MW) as in FIG. 9a. As a result, one main word line is used to drive eight subword lines, thereby creating a pitch of 8 subword lines to every main word line. But, since the subdecoder circuit consists of four transistors, it thereby consumes a lot of space, and to speed the circuit up, some of the transistors must be made very large.

Figure 9C:
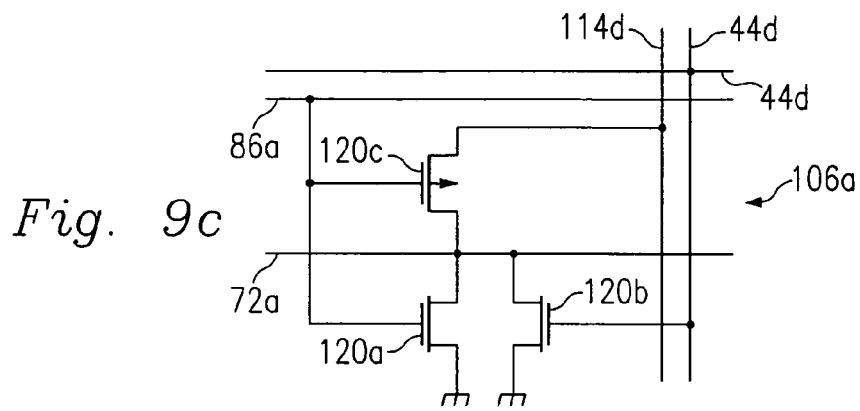
FIG. 9c is a schematic diagram of a preferred subdecoder circuit showing a hierarchical word line implementation of the present invention.

Referring to FIG. 9c, the subdecoder circuit 106a of the preferred embodiment comprises the advantages of the above two subdecoder drivers. The subdecoder circuit 106a uses the MWB bus 86a, the DXB7 bus 44d, and the DX7 bus 114d to produce the subword line SW bus 72a, thereby allowing the subdecoder circuit 106a to be constructed with only three transistors 120a–120c. Since the DX7 bus 114d runs only in the subdecoder 20a, and does not have to run horizontally across the array, the main word line pitch across the subarray 18a remains at eight subword lines for every main word line. As a result, there is sufficient metal space for the power, signal and subdecoder meshes 54, 56, 58 and 60, and the DXB bus 44 (FIG. 3) of the present invention.

In operation, the signals on the MWB bus 86a and DXB7 bus 44d, designated as MWB and DXB7, are negative logic signals, i.e. they are high in the standby mode, low in an enable mode. When the signals MWB and DXB7 are both low, an output signal on the subword line SW bus 72a is driven to a selective high level. When only one of the signals MWB or DXB7 is high, the output signal on the subword line SW bus 72a is driven to a non-selective low level. In the standby or precharge mode, i.e., when all of the MWB and DXB signals are high, all subword lines SW are set to low.

An advantage of the subdecoder circuit 106a is that a subthreshold current in the row decoders and DXB drivers is primarily determined by NMOS transistors 120a, 120b. As a result, a low standby current is achieved during standby or precharge mode. This is because a gate with for the NMOS transistors 120a, 120b can be narrower than that of PMOS transistors, and NMOS transistor cutoff-transition characteristics are sharper than that of PMOS transistors.

Other advantages of the subdecoder circuit 106a are that the subdecoder circuit 106a provides extra metal space for the power, signal and subdecoder meshes 54, 56, 58 and 60, and the subdecoder circuit 106a improves in speed performance. The speed of the subdecoder circuit 106a is directly proportional to the ability of the DX7 bus 114d to transition from low to high. Since the DX7 bus 114a is driven by the subdecoder driver 110a, and since the subdecoder driver is located in the non-crowded intersection area 24a, it can be made of sufficient size. Furthermore, the DX7 bus 114a is constructed in M3, which has the lowest resistance of the three metal layers. Thus, the DX7 bus 114a produces a sharp rising wave form, thereby achieving high speed activation of the SW bus 72a. In the preferred embodiment, a gate width (not shown) of the NMOS transistor 120b of is narrower than that of a gate width (also not shown) of the NMOS transistor 120a, thereby improving speed and layout area optimization. For example, in the preferred embodiment, the gate widths of transistors 120a and 102b are 2.2 microns and 1 micron, respectively. The narrow gate width of transistor 120b contributes to smaller load capacitance and faster fall times for signals on the DXB bus 44d. As a result, the DX bus 114d achieves faster rise times. In addition, the gate width of 120a is set to the sufficient value for falling speed of the subword line SW.

Figure 10A:
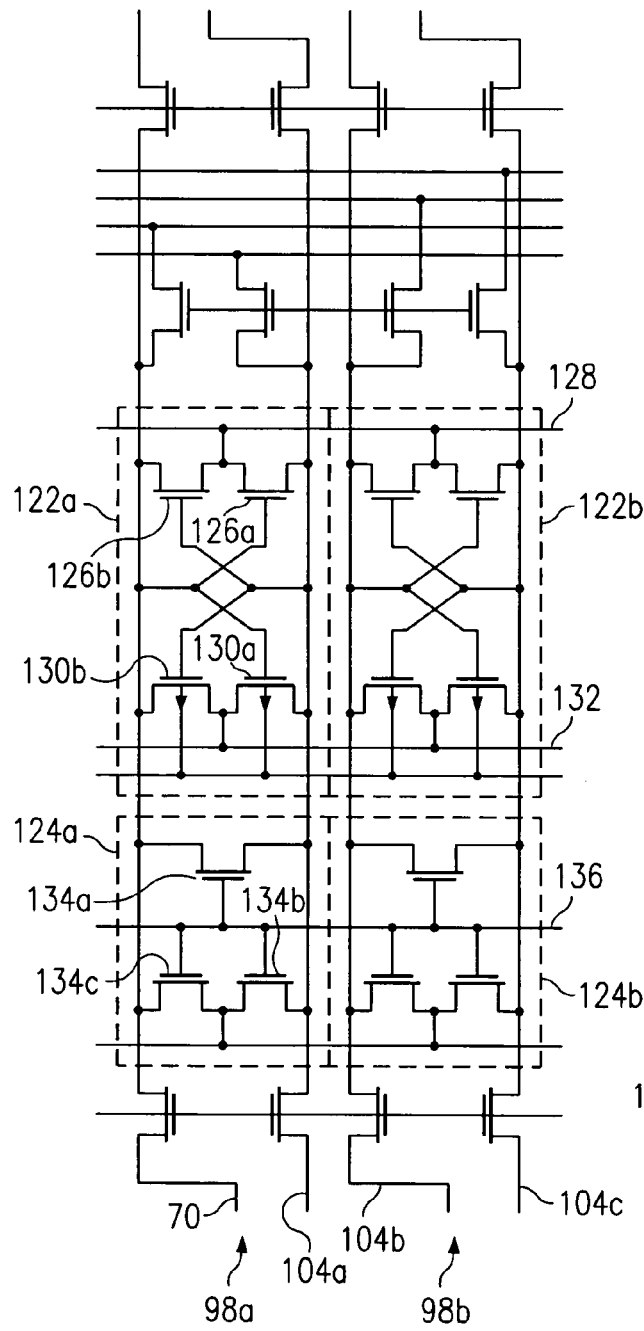

Referring to FIG. 10a, the sense amplifier circuit 98a comprises a latch section 122a and an equalizer section 124a. The latch section 122a comprises two NMOS transistors 126a–126b, connected between the bit line buses 70 and 104a and a first latch bus 128. The latch section 122a also comprises two PMOS transistors 130a–130b connected between the bit line buses 70 and 104a and a second latch bus 132. All four transistors 126a, 126b, 130a, 130b are cross-coupled in a conventional latching manner for storing signals from the bit line buses 70 and 104a.

The equalizer section 124a includes three NMOS transistors 134a–134c for equalizing the BL1 bus 70 and the BL1B bus 104a during the standby or pre-charge modes. The three transistors 134a–134c are controlled by an equalization bus 136.

In a similar manner, the sense amplifier circuit 98b comprises a latch section 122b and an equalizer section 124b connected to the bit line buses 104b–104c. The latch section 122b and the equalizer section 124b are also connected to the two latch buses 128, 132 and the equalization bus 136, respectively.

Figure 10B:
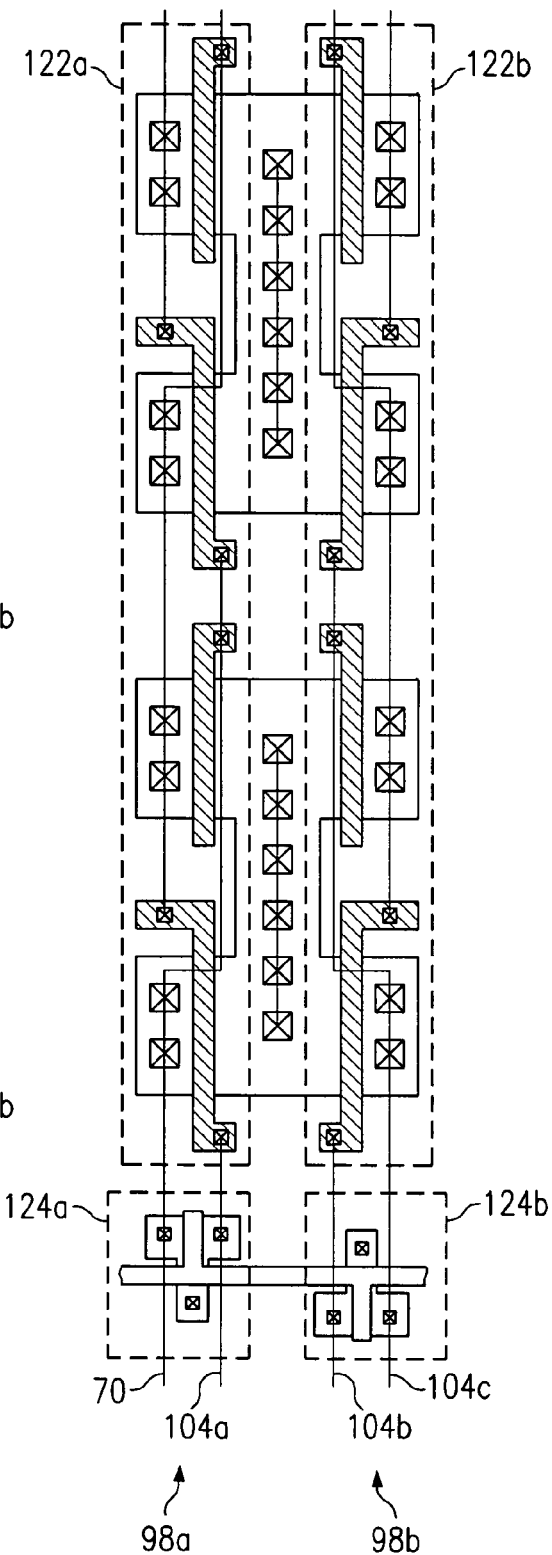

Referring to FIG. 10b, a further reduction in the size of the sense amplifier 22a is achieved by other layout improvements. The equalizer sections 124a and 124b are constructed in shapes of alternating "T's" as discussed in greater detail below with reference to FIG. 11a. The latch sections 122a and 122b are constructed utilizing "H" shaped moat regions, as discussed in greater detail below with reference to FIG. 12a–b.

Figure 11B:
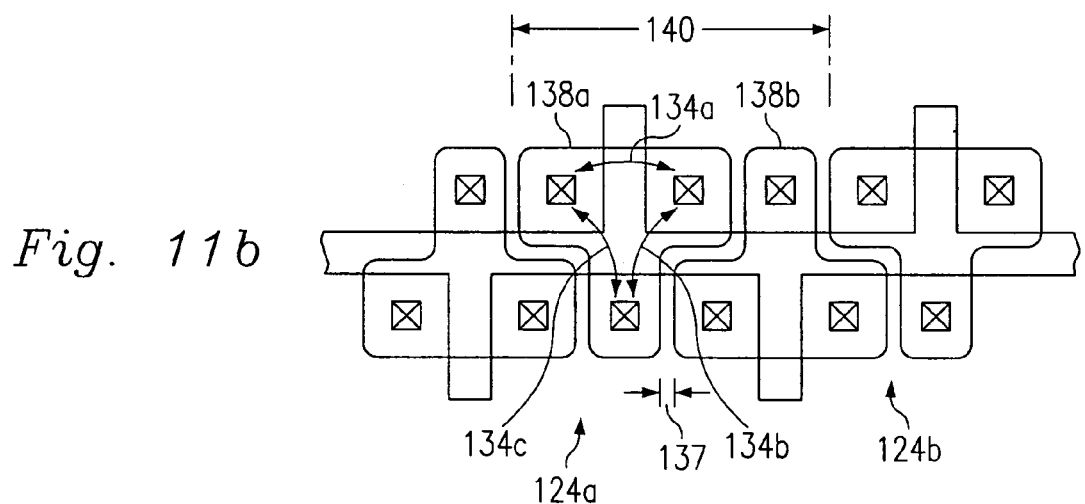
FIG. 11b is a layout diagram of a circuit used in the equalizer section of the sense amplifier circuit of FIG. 7a, utilizing an alternate T-shaped gate region of the present invention.
Figure 11A:
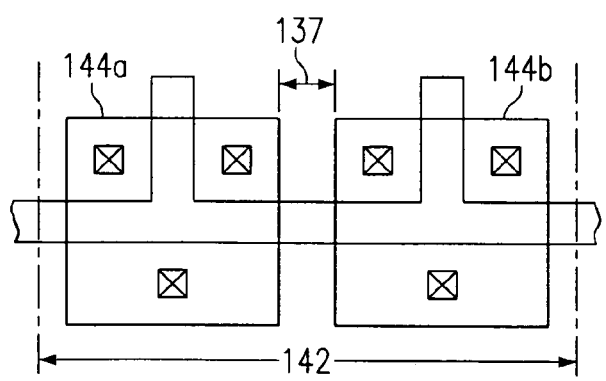
FIG. 11a is a layout diagram of a circuit used in an equalizer section of a conventional sense amplifier.

Referring to FIGS. 11a–11b, to reduce the size constraints of the equalizer section 124a caused by the transistors 134a–134c, a T-shaped gate region 138a (FIG. 11a) is utilized. The equalizer signal bus 136 creates a gate for each of the transistors 134a–134c. In a similar manner, the equalizer section 124b utilizes an inverted T-shaped gate region 138b. As a result, the gate regions 138a, 138b can be compacted together, while still maintaining a required moat isolation distance 137 between the gate regions 138a, 138b. In so doing, a width 140 of the two gate regions is smaller than a conventional width 142 of two square gate regions 144a and 144b, as shown in FIG. 11b, and a small sense amplifier circuit 22a corresponds to the small memory cell circuit 64 (FIG. 5a).

Figure 12A:
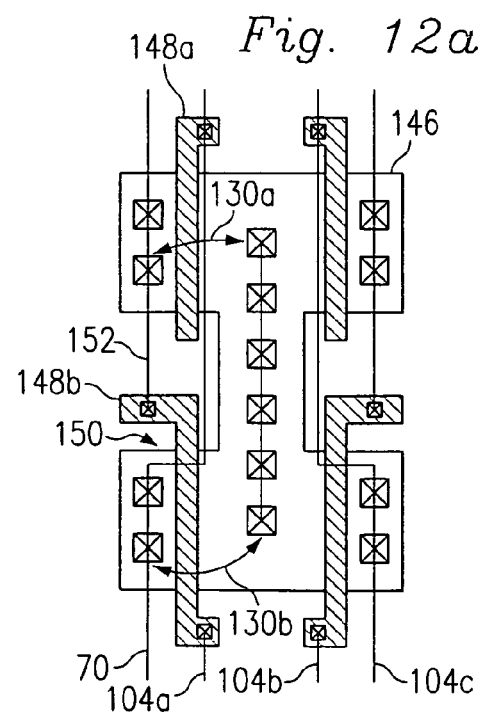
FIG. 12a is a layout diagram of a circuit used in the latch section of the sense amplifier circuit of FIG. 7a, utilizing the H-shaped moat region of FIG. 10b.

Referring to FIG. 12a, the sense amplifier 22a also comprises an H-shaped moat 146. The BL1 bus 70, constructed in M1, must cross the BL1B bus 104a, also constructed in M1, at the H-shaped moat 146 without electrically intersecting. Furthermore, the BL1 bus 70 must drive a transistor gate 148a and the BL1B bus 104a must drive a transistor gate 148b. At a crossing point 150, the BL1B bus 104a is connected to the transistor gate 148b, constructed in FG, which runs under the metal layers. The gate 148b not only serves to allow the BL1B bus 104a to cross the BL1 bus 70, but it is the gate for the transistor 130b. After crossing the BL1 bus 70, the gate 148b is reconnected to a connecting bus 152, also constructed in M1, thereby electrically connecting the BL1B bus 104a to the connecting bus 152. Similarly, the BL2 bus 104b and the BL2B 104c bus also cross in the H-shaped moat 146.

Referring to FIG. 12b, these connections create an M1 to FG to M1 change and construct the two PMOS transistors 130a–130b. Not only does this change provide a size reduction, it does so without using an additional metal layer.

Furthermore, the H-shaped moat 146 solves another problem associated with the meshed system, that is, noise on the bit line buses 70 and 104a–104c. Noise at the sense amplifiers 22a–22c is often caused by signal buses constructed in M3 overlapping the bit line buses 70 and 104a–c constructed in M1. Since the bit line buses 70 and 104a do a crossing pattern, any noise or capacitive coupling induced from signal buses constructed in M3, such as the CF bus or the YS bus, will be the same for both the BL1 bus 70 and the BL1B bus 104a, thereby effectively canceling the effect of noise. Likewise, any noise will be the same for the BL2 bus 104b and the BL2B bus 104c.

Referring to FIG. 13a, addition noise protection from signal buses constructed in M3 overlapping the bit line buses 70 and 104a–c constructed in M1 can be reduced through M2 shielding. For example, in conventional prior art designs having first and second buses 154a–154b constructed in M1 and running in a vertical direction, and having a third bus 154c constructed in M3 which also running in a vertical direction, noise is aggravated. Noise is induced from the third bus 154c to the first and second buses 154a and 154b, since they overlap and run in the same direction, allowing the noise to be strengthened by the large area of overlap. This conventional design can be a problem, especially when the buses 154a, 154b are particularly sensitive to noise, such as the bit line buses 70 and 104a of the present invention. Furthermore, in the conventional design, a group of other buses 156a–156d constructed in M2 and running in a horizontal direction have little to no shielding effect, as shown.

Referring to FIGS. 13b–13c, the preferred embodiment reduces the noise between buses running in the same direction by improving the shielding effect of the M2 buses. In the preferred embodiment, the BL1 bus 70 and the BL1B bus 104a are constructed in M1 and run in the vertical direction. Furthermore, the CF bus 61a is constructed in M3 and runs in the vertical direction, just above the two bit line buses 70 and 104a. Located between the CF bus 61a and the bit line buses 70 and 104a are four buses 158a–158d constructed in M2 and running in the horizontal directions.

Referring to FIG. 13b, one technique for reducing noise is used in a situation where the M2 buses 158a and 158d are noisy, active lines, such as parts of the sense amplifiers, and the M2 buses 158b–c are inactive, quiet buses, such as a power supply bus, a first technique is used. Instead of having some of the M2 buses 158a–158d only extending across one of the bit line buses 70 and 104a, as shown in FIG. 13a, the M2 buses 158b–158c now extend over both bit line buses. In this manner, the M2 buses 158a–158d provide more of a shielding affect from any noise from the CF bus 61a.

Referring to FIG. 13c, in a situation where two of the M2 buses 158a and 158d are inactive, quiet buses, such as a power supply bus, and the other two of the M2 buses 158b, 158c are active, noisy buses, a second technique is used. In this case, the bit line buses 70 and 104a are better shielded from the noise of the CF bus 61 a by the quiet M2 buses 158a, 158d. Therefore, the quiet M2 buses 158a, 158d are drawn as large as possible, thereby maximizing their shielding affect.

Referring to FIG. 14a, the well structure of the sense amplifier can also be size determinative, especially in a situation like the preferred invention where power and signal meshes are utilized. In a first design, a triple well structure 160 comprising a p well (PW) 162a, a deep well (DW) 164a and a p-substrate (P-Sub) 166 is used for noise protection from a sense amplifier circuit 170 to a subarray 168a. Likewise, the triple well structure 160 comprises a p well (PW) 162b, a deep n-type well (DW) 164b and the P-Sub 166 for noise protection from a sense amplifier circuit 170 to a subarray 168b. Although the wells 162a, 162b, 164a, 164b and substrate 166 may have various bias arrangements, one such arrangement provides:

TABLE 1

| Well | Bias Name | Bias Voltage |
|---|---|---|
| PW over DW | VBBA 167a | −1 V |
| NW over DW | VPP 167b | 4.0 V |
| DW | VPP 167b | 4.0 V |
| P-Sub | VBB 167c | 0 V |
| PW (not over DW) | VBB 167c | 0 V |
| NW (not over DW) | VDD 167d | 3.3 V |

It is noted that well biasing is well known in the art, and any descriptions of bias voltage are merely illustrative, and should not be limited to such in any manner.

The subarrays 168a and 168b are isolated from the noisy effects of the sense amplifiers 170 by two isolation n wells (NWs) 172a and 172b, respectively. The NWs 172a, 172b create separation transistors for sharing one sense amplifier between memory cell arrays located on either side. A negative bias voltage that is suitable for device isolation is supplied to the P-wells 162s and 162b, where the above described separation transistors and the memory cell transistors are both located. The NWs 172a, 172b are biased to $V_{PP}$ 167b for electrical isolation. Furthermore, the NW's 172a, 172b are located above the DWs 164a, 164b, respectively, and thereby bias the DWs to $V_{PP}$. The sense amplifier circuit 170 has an additional NW 174, which is biased to $V_{DD}$ 167d to provide faster operation of a p-type transistor 176. The advantage for DWs 164a, 164b being biased to $V_{PP}$ is that the subdecoders are CMOS circuits operating at the $V_{PP}$ voltage level (FIGS. 7a, 7b, 14c). On the other hand, because PMOS transistors of the sense amplifier circuit 170 operate at or below the $V_{DD}$ voltage level, the $V_{DD}$ voltage level is suitable as a bias voltage for the NW 174, instead of the $V_{PP}$ voltage level. The sense amplifier 170 also has two PWs 178a, 178b, biased to $V_{BB}$ 167c through the P-sub 166. The PW 178a supports a transistor 180a and the PW 178b supports transistors 180b, 180c.

Figure 14B:
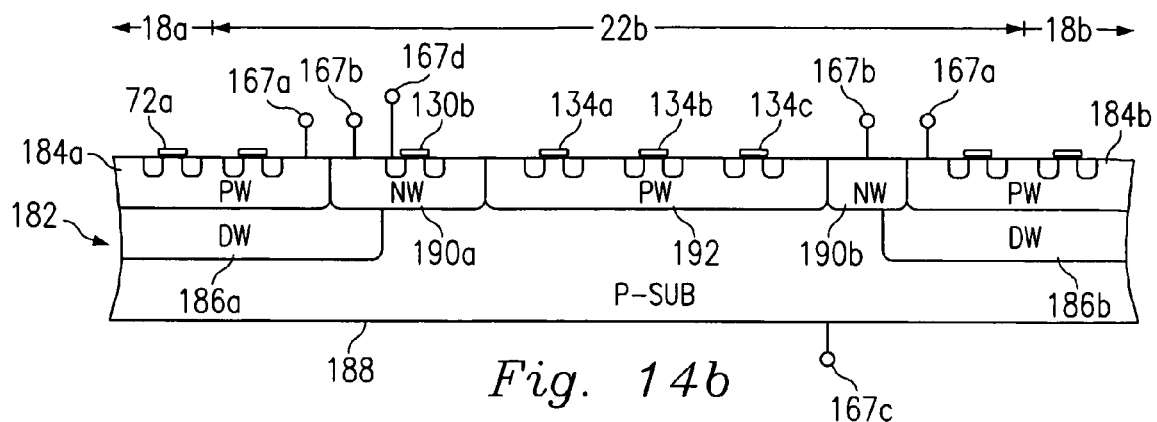
FIG. 14b is a second cross sectional view of the sense amplifier of FIG. 2, using a triple well structure.
Figure 14C:
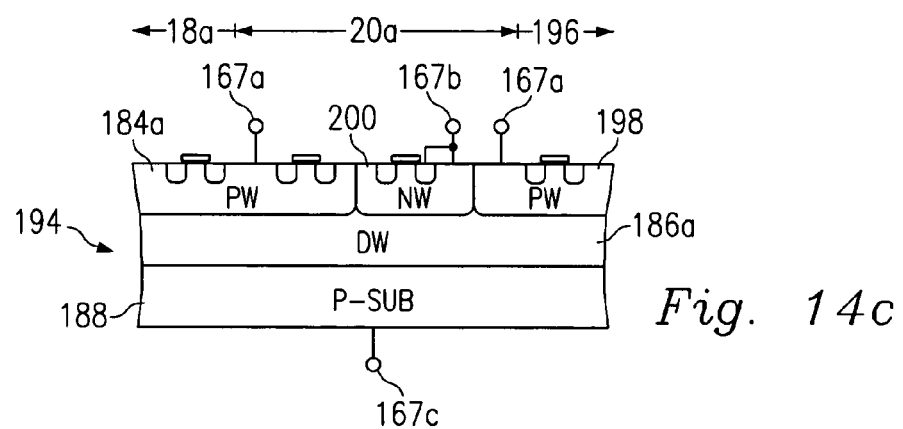
FIG. 14c is a cross sectional view of the subdecoder of FIG. 2 using a triple well structure.

Referring to FIG. 14b, the preferred embodiment is able to shrink the well structure of the sense amplifier 24b, as compared to FIG. 14a. The preferred embodiment utilizes a triple well structure 182 comprising a PW 184a, a DW 186a, and a P-Sub 188, for subarray 18a, and a PW 184b, a DW 186b, and the P-Sub 188, for subarray 18b. The subarrays 18a–18b are thereby protected from the sense amplifier circuit 22b. The triple well structure 182 also uses well-biasing similar to the illustrative biases described in Table 1. It is noted, however, that well biasing is well known in the art, and any descriptions of bias voltage are merely illustrative, and should not be limited to such in any manner.

The subarrays 18a–18b are isolated from the noisy effects of the sense amplifiers 24b by two isolation NWs 190a, 190b, respectively. The isolation NWs 190a, 190b are biased to $V_{PP}$ 167b for isolation. Furthermore, the isolation NWs 190a, 190b are located above the DWs 186a–186b, respectively, and thereby bias the DWs. The preferred embodiment differs from the conventional system of FIG. 14a in that the isolation NW 190a also supports the transistor 130d, which corresponds with the transistor 176 of FIG. 14a. As a result, the transistor 130d will operate slower than the transistor 176 of FIG. 14a. However, the speed of the transistor 130d is not critical to the overall timing of the sense amplifier circuit 90a. Therefore, although the PMOS transistor 130d is using a $V_{PP}$ biased well, there is no overall speed degradation.

There is a size advantage, however, to the isolation NW 190a over the conventional technique described in FIG. 14a. Instead of having the NW 172a for the sole purpose of isolation, and the second NW 174 for the transistor 176 (FIG. 14a), the two are combined in the NW 190a of the preferred embodiment, thereby shrinking the space of the sense amplifier 24b. Furthermore, a single PW 192 can be used to support the transistors 134a–134c.

Referring to FIG. 14c, a triple well structure 193 is implemented for the subdecoder 20a. The P-Sub 188 and the DW 186a extend throughout the subarray 18a (FIG. 14b), across the subdecoder 20a, and into a subarray 196. The PW 184a is separated from a PW 198 by an NW 200, which is biased to $V_{PP}$ 167b for isolation. By biasing the NW 200 at $V_{PP}$ 167b, the SW bus 72a can operate at $V_{PP}$.

Figure 15A:
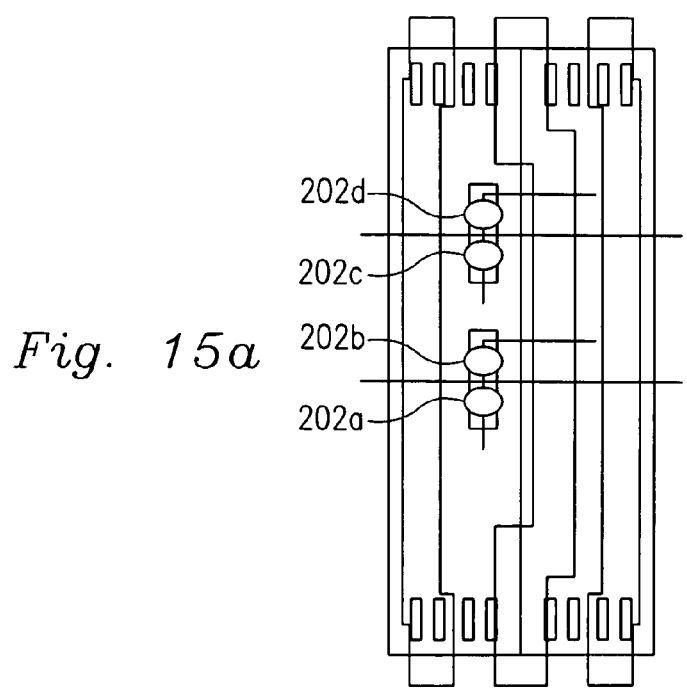
FIG. 15a is a block diagram showing four fuses used for the sense amplifiers of FIG. 2 and two additional sense amplifiers.
Figure 15B:
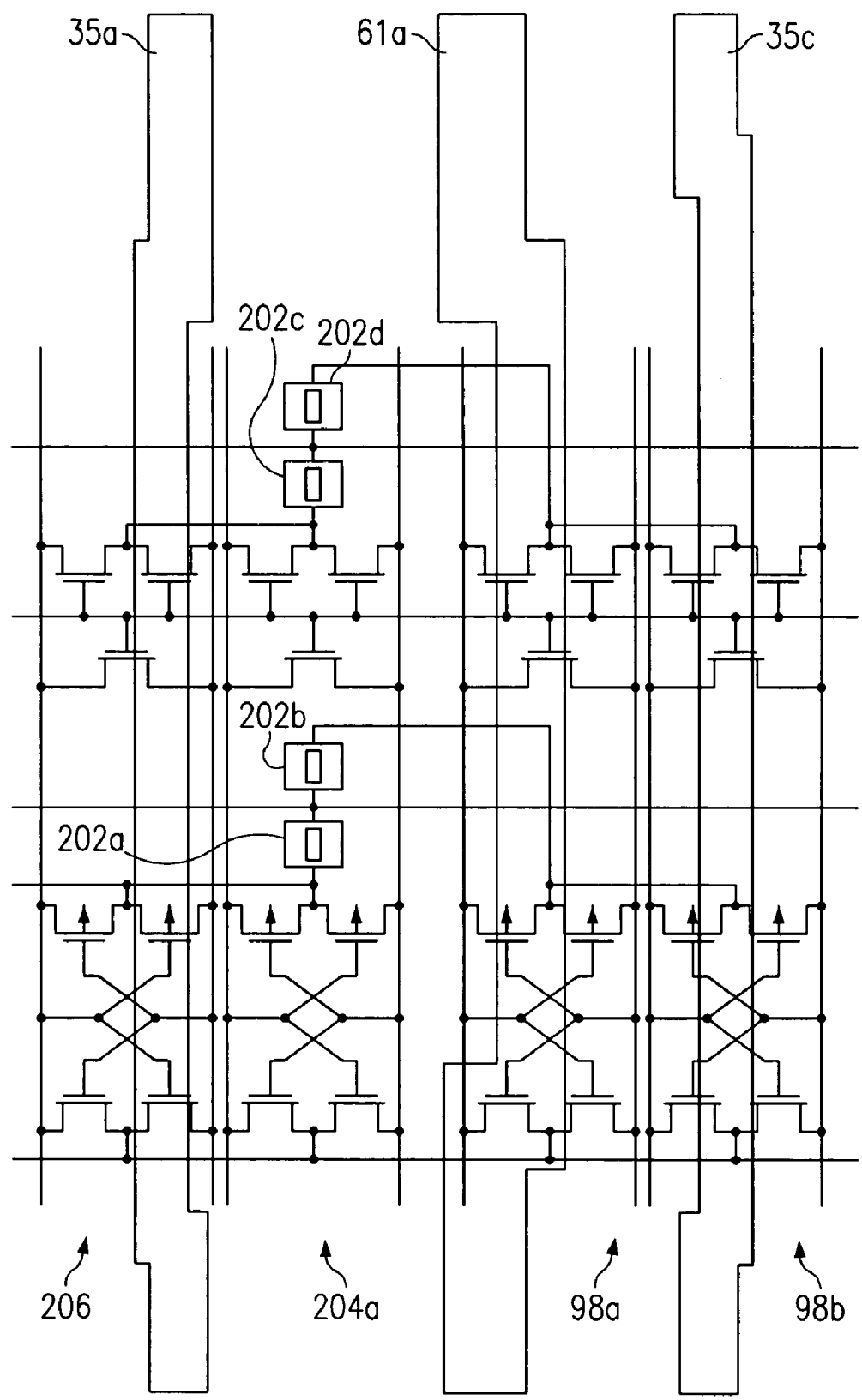
FIG. 15b is a schematic diagram showing four fuses used for the sense amplifiers of FIG. 2 and two additional sense amplifiers.

Referring to FIGS. 15a and 15b, the sense amplifier 22a includes four fuses 202a–202d used for a column redundancy scheme. The two fuses 202b and 202d are used to disable sense amplifier circuits 98a–98b, and the two fuses 202a and 202c are used to disable sense amplifier circuits 204a–204b. Column redundancy is well known to those skilled in the art; however, conventional designs result in a dramatic area penalty in the sense amplifier design due to the fuse placement. Accordingly, in the preferred embodiment, the fuses 202a–202d are lined in parallel with the bit line buses 70 and 104a, even for the fuses corresponding to sense amplifiers located in a different area. In this way, the vertical running CF bus 61a and the YS buses 35c–35d need to be offset for only one group of fuses, thereby providing the maximum space for the power and signal meshes 54, 56, 58 and 60.

Although the illustrative embodiment of the present invention has been shown and described, a latitude of modification, change and substitution is intended in the foregoing disclosure, and in certain instances, some features of the invention will be employed without a corresponding use of other features. For example, the horizontal and vertical directions were included to make the preferred embodiment simpler to describe, but are not intended to limit the present invention. Accordingly, it is appropriate that the appended claims be construed broadly and in a manner consistent with the scope of the invention.

What is claimed is:
1. A semiconductor memory device comprising:
   a plurality of memory arrays including a plurality of memory cells which are provided at intersections of a plurality of word lines and a plurality of bit lines and formed in a first area;
   a plurality of sense amplifier coupled to the plurality of bit lines and formed in a second area;
   a plurality of address subdecoders coupled to the plurality of word lines and formed in a third area;
   a plurality of first voltage lines extending in a first direction;
   a plurality of second voltage lines extending in a second direction;
   a plurality of third voltage lines extending in the first direction;
   a plurality of fourth voltage lines extending in the second direction;
   a first bonding pad connected to the plurality of first voltage lines and configured for supplying first voltage to the semiconductor memory device;

a second bonding pad connected to the plurality of third voltage lines and configured for supplying a second voltage smaller than the first voltage to the semiconductor memory device; and a plurality of contacts each coupled between one of the plurality of first voltage lines and one of the plurality of second voltage lines, or between one of the plurality of third voltage lines and one of the plurality of fourth voltage lines, wherein the plurality of contacts are provided above the plurality of memory arrays at the first area.

2. A semiconductor memory device according to claim 1, wherein each of the plurality of memory cells is a dynamic memory cells.

3. A semiconductor memory device according to claim 2, wherein each of the plurality of memory cells has a transistor and a capacitor, and wherein each of the plurality of contacts are provided above the capacitor included in corresponding one of the plurality of memory cells.

\* \* \* \* \*